(12) United States Patent
Yu et al.

(10) Patent No.: US 6,198,291 B1
(45) Date of Patent: Mar. 6, 2001

(54) DOUBLE-SPEED TESTER AND METHOD OF USE THEREOF FOR TESTING MICROELECTRONIC DEVICES

(75) Inventors: Seok Jong Yu; Yoon Heung Han; Houng Gyu Lim, all of Suwon-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 08/978,542

(22) Filed: Nov. 26, 1997

(30) Foreign Application Priority Data

Jun. 30, 1997 (KR) ................................................ 97-29901

(51) Int. Cl.⁷ .................................................. B07C 5/344
(52) U.S. Cl. ........................ 324/551; 324/158.1; 209/574
(58) Field of Search ..................................... 324/551, 522, 324/525, 718, 548, 549, 158.1; 209/574

(56) References Cited

U.S. PATENT DOCUMENTS

| 4,406,373 | 9/1983 | Braden | 209/574 |
| 5,262,729 | * 11/1993 | Kawabata et al. | 324/548 |
| 5,785,484 | * 7/1998 | Garcia | 414/417 |

* cited by examiner

Primary Examiner—Josie Ballato
Assistant Examiner—T. R. Sundaram
(74) Attorney, Agent, or Firm—Webb Ziesenheim Logsdon Orkin & Hanson, P.C.

(57) ABSTRACT

A double-speed tester for a microelectronic device, in which a plurality of recesses is formed on the circumference of a test plate at an interval of step, the recesses each accommodating a microelectronic device which is measured with the test plate rotating. The tester includes: a motor controller for controlling the test plate to rotate two steps at one time; a first connector for connecting to the microelectronic device which stops thereat; a second connector for connecting to a microelectronic device which stops at the second measurement location; a first measurer for measuring the microelectronic device connected to the first connector; a second measurer for measuring the microelectronic device connected to the second measurer; a first testing section for applying a high voltage to the microelectronic device whose value is measured by the first measurer; a second testing section for applying a high voltage to the microelectronic device whose value is measured by the second measurer; and a microcomputer for outputting a control signal, comparing the value measured by the first or second measurer, with reference data, and checking the quality of insulation of the microelectronic device according to the insulation test result by the first or second testing section.

13 Claims, 7 Drawing Sheets

DOUBLE-SPEED TESTER AND METHOD OF USE THEREOF FOR TESTING MICROELECTRONIC DEVICES

FIELD OF THE INVENTION

The present invention relates to a tester and its method for a microelectronic device and more particularly, to a double-speed tester and its method for a microelectronic device, in which recesses, formed in predetermined intervals on the circumference of a disk-shaped test plate, accommodate microelectronic devices, such as multi-layer ceramic capacitors (MLCC), and the test plate rotates by two steps at one time, to thereby test them at two points.

BACKGROUND OF THE INVENTION

Generally speaking, such microelectronic devices as MLCCs are chosen after the failure/quality test at a final process in their manufacturing procedure. For the test, the electric devices are aligned on a test plate, and a probe makes contact therewith.

Figure 1:
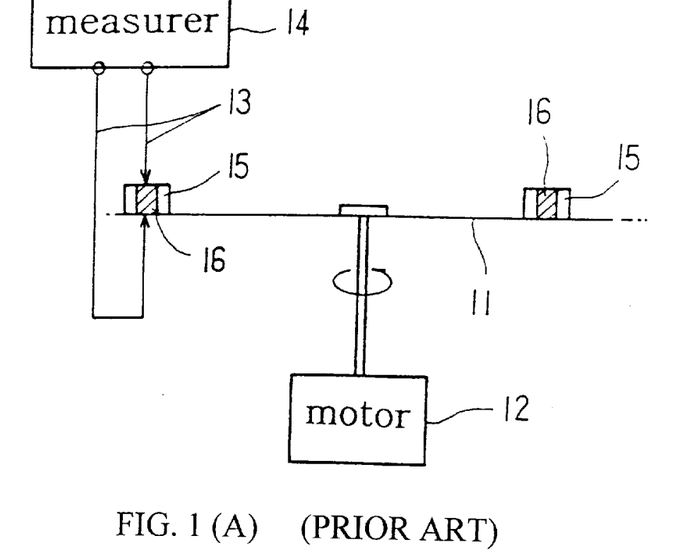
FIG. 1A shows a tester for microelectronic devices.
FIG. 1B is a plan view of the test plate of FIG. 1A in which the microelectronic devices are aligned.

FIG. 1A shows a section of an electric device tester, 1B being a plan view of the test plate of FIG. 1A with the microelectronic devices mounted. As shown in these drawings, the microelectronic device tester includes: a test plate 11 in which recesses 15 are formed on the circumference of a disk at predetermined intervals to receive microelectronic devices 16 therein; a motor 12 for rotating test plate 11; a probe 13 installed at its measurement location and making contact with one of the microelectronic devices 16; and a meter 14 for measuring microelectronic devices 16 through probe 13.

In order to measure microelectronic devices, they are first aligned in recesses 15 formed on the disk-shaped test plate. Motor 12 is then driven to rotate test plate 11. When test plate 11 rotates for devices 16 to reach their test locations, motor 12 stops, and then probe 13 makes contact with devices 16 reached. Meter 14 measures devices 16 received in recesses 15 of test plate 11 through probe 13 connected to devices 16.

Figure 2:
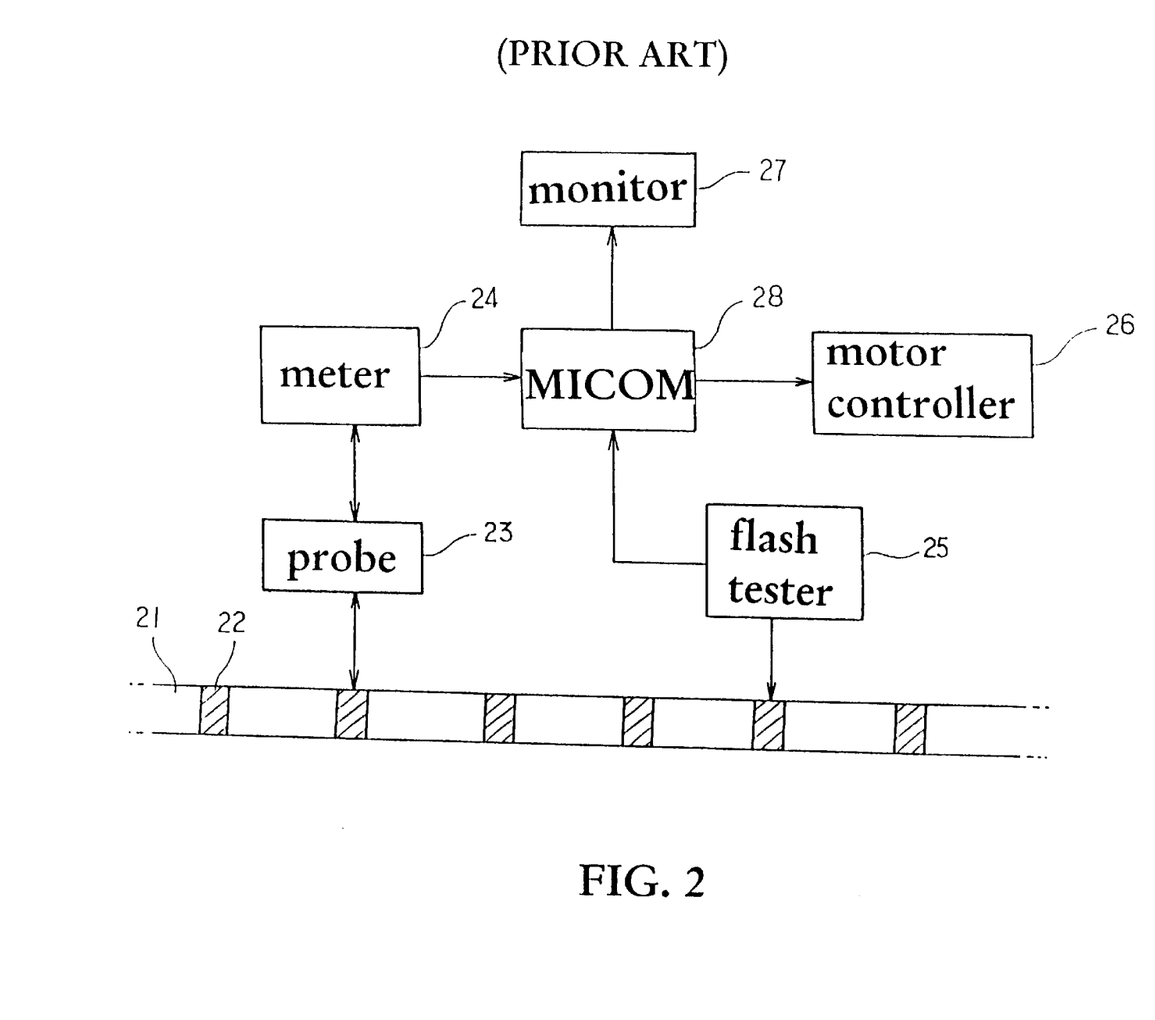
FIG. 2 is a block diagram of a conventional tester for microelectronic devices.

FIG. 2 is a block diagram of a conventional tester for microelectronic devices. This tester contains: a probe 23 installed at its measurement location to make contact with the devices 22 accommodated in test plate 21's recesses; an RLC meter 24 for measuring devices 22 through probe 23; a flash tester 25 for checking the insulation of devices 22 by applying a high voltage thereto; a motor controller 26 for controlling the rotation speed and position of a motor which rotates test plate 21; a monitor 27 for displaying the devices' measurement status and information required; and a microcomputer 28 for outputting a control signal which controls the motor's speed and location so that test plate 25 places each devices 22 at the measurement location, and for comparing the measurement result of RLC meter 24 and flash tester 25 with reference data in order to find out the devices' quality or failure.

Figure 3A:
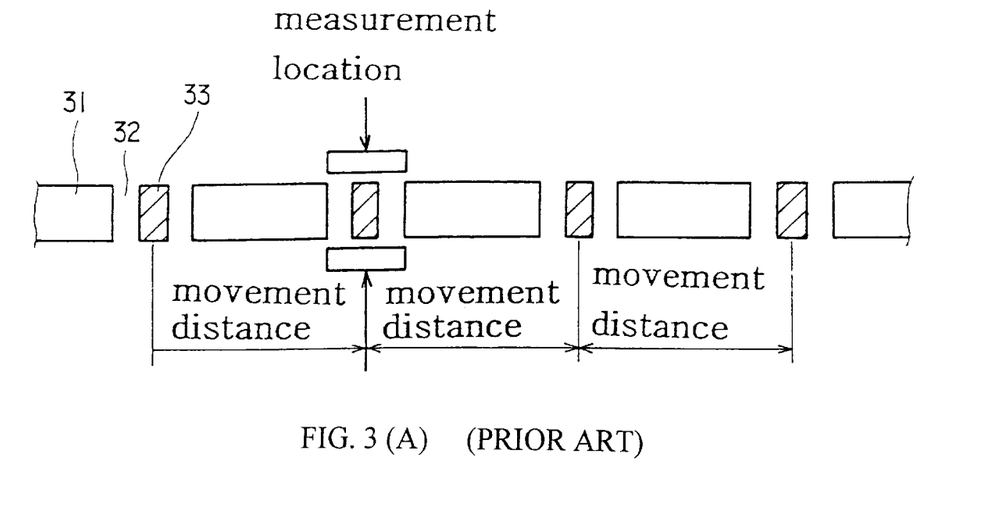
FIG. 3A is a sectional view of the test plate for explaining the operation of the conventional tester.

FIG. 3A shows a circumferential section of the test plate for explaining the operation of the conventional tester. In this drawing recesses 32 are formed on the circumference of test plate 31 at a predetermined interval, each containing microelectronic device 33. When the motor is driven to rotate the test plate, it moves by one step from the current recess to the next, and then the motor stops. In this situation a device 33 to be measured stops at the measurement location, and the probe installed thereat makes contact with the device 33 in order to check its quality or failure.

Figure 3B:
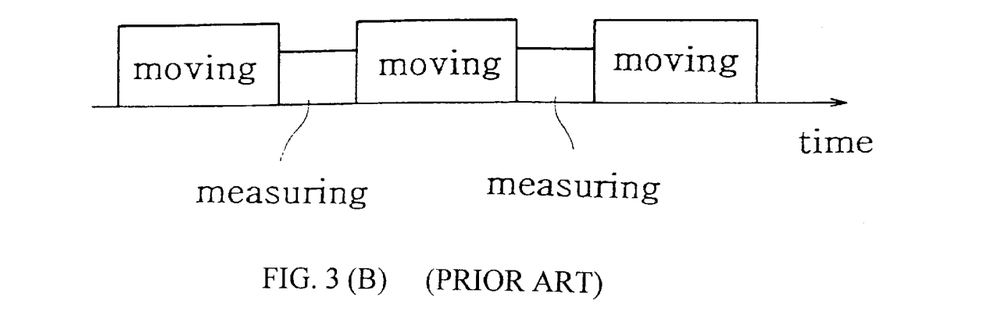
FIG. 3B is a timing diagram of the operation of the conventional tester.

FIG. 3B is a timing diagram of the operation of the conventional tester for microelectronic devices, showing the time period taken for the tester's movement and measurement with respect to the time axis. According to FIG. 3B, the movement time is taken longer than the measurement time because the test plate rotates only by one step between the recesses containing the microelectronic devices to thereby measure a single device at the location moved. This effect does not afford a great amount of products.

SUMMARY OF THE INVENTION

Therefore, in order to overcome such drawbacks of the prior art, an object of the present invention is to provide a double-speed tester for a microelectronic device, in which a plurality of microelectronic devices are received in recesses formed at a predetermined interval on the circumference of the disk-shaped test plate, and this plate is rotated two steps at one time, in order to measure the devices at two points.

To accomplish the object of the present invention, there is provided a double-speed tester for a microelectronic device, in which a plurality of recesses is formed on the circumference of a test plate at an interval of step, the recesses each accommodating a microelectronic device which is measured with the test plate rotating, the tester comprising: a motor controller for controlling a motor so that the test plate rotates two steps at one time; a first connector installed at a first measurement location for connecting to the microelectronic device which stops thereat; a second connector installed at a second measurement location adjoining the first measurement location at an interval of one step, for connecting to a microelectronic device which stops at the second measurement location; a first measurer connected to the first connector for measuring the microelectronic device connected to the first connector; a second measurer connected to the second connector for measuring the microelectronic device connected to the second measurer; a first testing section for applying a high voltage to the microelectronic device whose value is measured by the first measurer, in order to check the degree of its insulation; a second testing section for applying a high voltage to the microelectronic device whose value is measured by the second measurer, in order to check the degree of its insulation; and a microcomputer for outputting a control signal which turns ON or OFF the operation of the motor in order to rotate the test plate, and comparing the value measured by the first or second measurer, with reference data, in order to check the microelectronic device's failure or quality, the microcomputer further checking the quality of insulation of the microelectronic device according to the insulation test result by the first or second testing section.

According to another aspect of the present invention, there is provided a double-speed tester for a microelectronic device, in which a plurality of recesses is formed on the circumference of a test plate at an interval of step, the recesses each accommodating a microelectronic device which is measured with the test plate rotating, the tester comprising: a motor controller for controlling a motor so that the test plate rotates two steps at one time; a first connector installed at a first measurement location for connecting to the microelectronic device which stops thereat; a second connector installed at a second measurement location adjoining the first measurement location at an interval of one step, for connecting to a microelectronic device which stops at the second measurement location; a measurer for measuring the microelectronic device; a scanning section connected between the first and second connectors and the measurer for connecting the first and second connectors sequentially to the measurer; a first testing section connected to the first connector for applying a high voltage to the microelectronic device whose value is measured by the first connector, in order to check the degree of its insulation; a second testing section connected to the second connector for applying a high voltage to the microelectronic device whose value is measured by the second connector, in order to check the degree of its insulation; and a microcomputer for outputting a control signal which turns ON or OFF the operation of the motor in order to rotate the test plate, and comparing the value measured by the measurer, with reference data, in order to check the microelectronic device's failure or quality, the microcomputer further checking the quality of insulation of the microelectronic device according to the insulation test result by the first or second testing section.

According to yet another aspect of the present invention, there is provided a method of testing a microelectronic device, with a test plate having a plurality of recesses formed on its circumference at an interval of step, the recesses each accommodating a microelectronic device which is measured with the test plate rotating, the method comprising the steps of: (1) controlling a motor so that the test plate rotates by two steps at one time; (2) connecting a measurer to the electric devices aligned in nearby two recesses while the test plate is stationary; (3) simultaneously or sequentially measuring the microelectronic devices aligned in two recesses through the measurer connected in the step (2); (4) applying a high voltage to one of the microelectronic devices whose values are measured in the step (3) in order to check the degree of its insulation; (5) applying a high voltage to the other of the microelectronic devices whose values are measured in the step (3) in order to check the degree of its insulation; and (6) comparing the values measured in the step (3) with reference data in order to check the microelectronic device's failure or quality, and determining the quality of the microelectronic devices' insulation according to the test result obtained in the steps (4) and (5).

BRIEF DESCRIPTION OF THE ATTACHED DRAWINGS

These and other features of the invention will be understood more clearly from the following description, read in conjunction with the drawings, in which.

DETAILED DESCRIPTION OF THE INVENTION

Hereinafter, the configuration and operation of the first embodiment of the present invention will be described in detail, with reference to the attached drawings.

Figure 4:
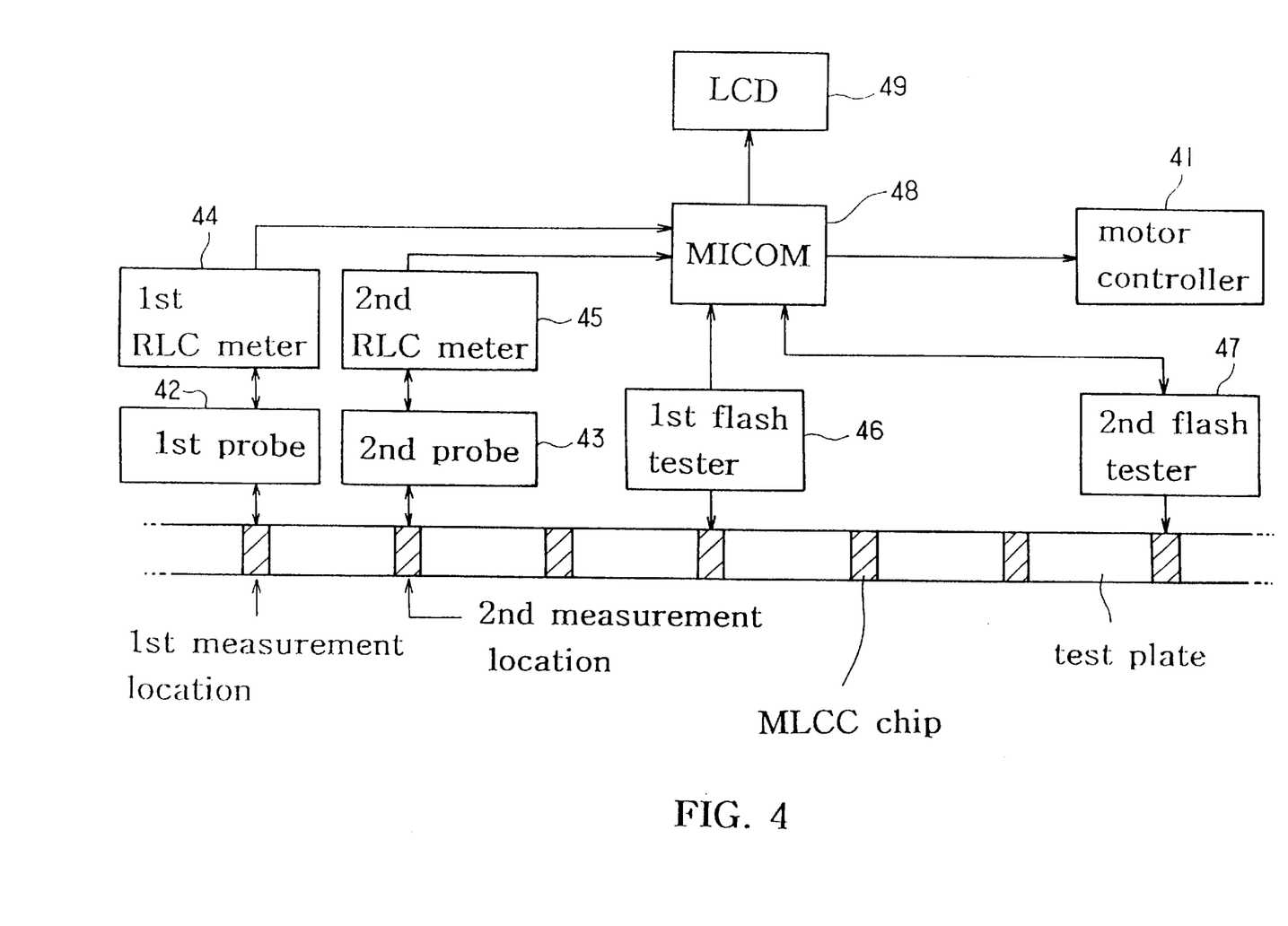
FIG. 4 is a block diagram of the first embodiment of a microelectronic device tester of the present invention.

Referring to FIG. 4, the first embodiment of the double-speed tester of the present invention comprises: a motor controller 41 for controlling the motor according to a signal from the microcomputer 48 so that the test plate rotates two steps at one time; a first probe 42 for connecting a microelectronic device which stops at a first measurement location to a first RLC meter 44; a second probe 43 for connecting a second RLC meter 45 to a microelectronic device which stops at a second measurement location adjoining the first measurement location at an interval of one step; the first RLC meter 44 for measuring the microelectronic device connected to the first probe 42 and sending the result to microcomputer 48; the second RLC meter 45 for measuring the microelectronic device connected to the second probe 43 and sending the result to microcomputer 48; first and second flash testers 46 and 47 for applying a high voltage to the microelectronic devices whose values are measured by the first and second RLC meters 44 and 45, respectively, according to microcomputer 48, in order to check the degree of insulation, which is sent to the microcomputer; the microcomputer 48 for outputting the control signal which turns ON or OFF the operation of the motor in order to rotate the test plate, comparing the value measured by the first or second RLC meter 44 or 45, with reference data, in order to check the microelectronic device's failure or quality, and checking the quality of insulation of the microelectronic device according to the insulation test result by the first or second flash tester 46 or 47; and an LCD 49 for displaying required information and operation status of the tester according to microcomputer 48.

Motor controller 41 controls the motor so that the test plate rotates two steps at one time. According to the prior art, the motor's acceleration/deceleration section is so narrow as to limit the increase of the rotation speed because it rotates by one step. However, in this embodiment, the acceleration/deceleration section increases to enable higher speed rotation because the motor rotates by two steps, enhancing working efficiency. The motor controller is able to control the motor so that, when the test plate rotates by two steps at one time, it rotates 1.5–2 times the average speed of the test plate which rotates by one step, because the acceleration/deceleration section increases even when the test plate is controlled with the same profile as when it rotates by one step at one time.

The first probe 42 is installed to make contact with a microelectronic device contained in a recess of the test plate while it stops, and the second probe 43 at the measurement location adjacent to the first probe 42 at the interval of one step. While the first and second probes 42 and 43 may not adjoin each other, the second probe 43 is preferably installed at an even place, adjacent to the first probe 42 at the interval of one step, because the test plate tilts at a predetermined angle according to the characteristics of the tester of the present invention. It is therefore required that the first and second probes 42 and 43 be made slim because of their narrow space allowed. The first and second probes 42 and 43 experience reduced wear because they are in continuous contact with the devices to be measured, when the test plate rotates. For this reason, the probes should satisfy the shape and material easily exchangeable.

First and second RLC meters 44 and 45 are located to measure the microelectronic devices respectively connected to first and second probes 42 and 43. Those meters operate simultaneously, and send the measurement result to microcomputer 48.

First and second flash testers 46 and 47 apply a high voltage to microelectronic devices whose values are measured respectively by the first and second RLC meters 44 and 45, according to microcomputer 48, for the purpose of checking the degree of insulation. Their targets are microelectronic devices preceding microelectronic devices whose values are currently measured by the first and second RLC meters 44 and 45. This is because the first and second flash testers 46 and 47 are hard to install integrally with the first and second probes 42 and 43 at the first and second measurement locations where they are mounted.

Microcomputer 48 outputs a control signal which turns ON or OFF the operation of the motor in order to rotate the test plate. The control signal is output depending upon the amount of rotation of the motor in accordance with the interval between recesses so that the microelectronic devices aligned on the test plate stop at the measurement locations. Microcomputer 48 compares the measurement value input by the first or second RLC meter 44 or 45, with reference data. According to amounts of their difference, the levels are determined such as first level, second level, etc. If the difference is great, this is determined as failure. With the insulation test result of the first or second flash tester 46 or 47, the quality of the microelectronic devices' insulation is also determined.

Figure 6:
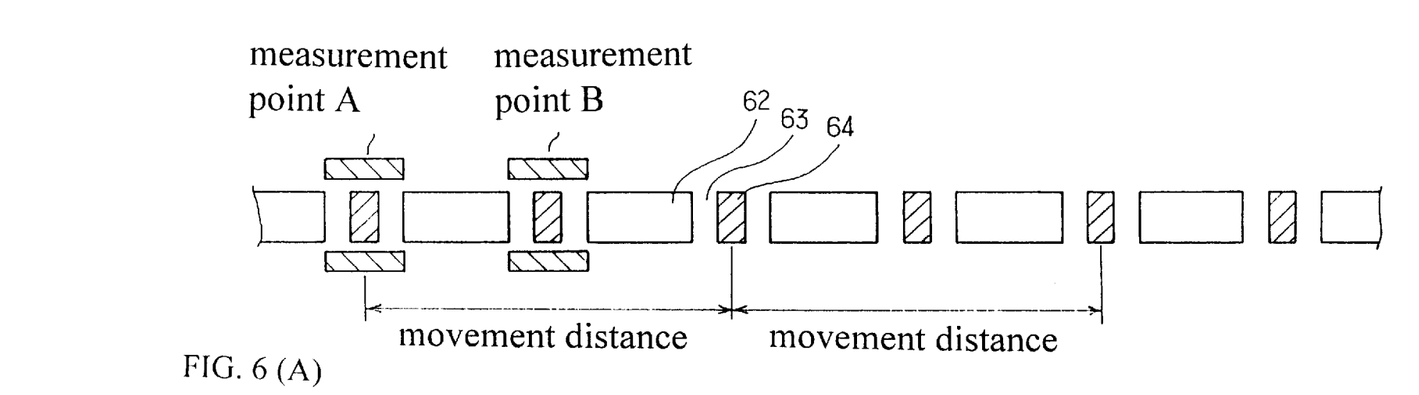
FIG. 6A is a section of the test plate for explaining the operation of the embodiments of the present invention.
FIG. 6B is a timing diagram of the first embodiment of the present invention.
FIG. 6C is a timing diagram of the second embodiment of the present invention.

Turning to FIG. 6A, recesses 63 are formed on the circumference of test plate 62 at a predetermined interval of step. The recesses each contain a microelectronic device 64. When the motor is driven to rotate the test plate, it rotates by two steps, passing the current recess and the next, and then the motor stops. In this state microelectronic devices to be measured stop at their measurement locations, and the probes installed two points at the locations make contact with the devices. Using the meters, the microelectronic devices' failure and quality can be thus measured.

Referring to FIG. 6B, the moving time is shortened because two measurements occur simultaneously between movement of the tester, thereby reducing the working time taken. In this embodiment the measurement time of the first and second RLC meters 44 and 45 is taken about 32 $\mu s$, which is sufficiently smaller than about 80 $\mu s$, the measurement time of the first and second flash testers 46 and 47. This enables the first and second RLC meters 44 and 45's measurement within the first and second flash testers 46 and 47's measurement time.

From now on, the configuration and operation of the second embodiment of the present invention will be stated referring to the drawings.

Figure 5:
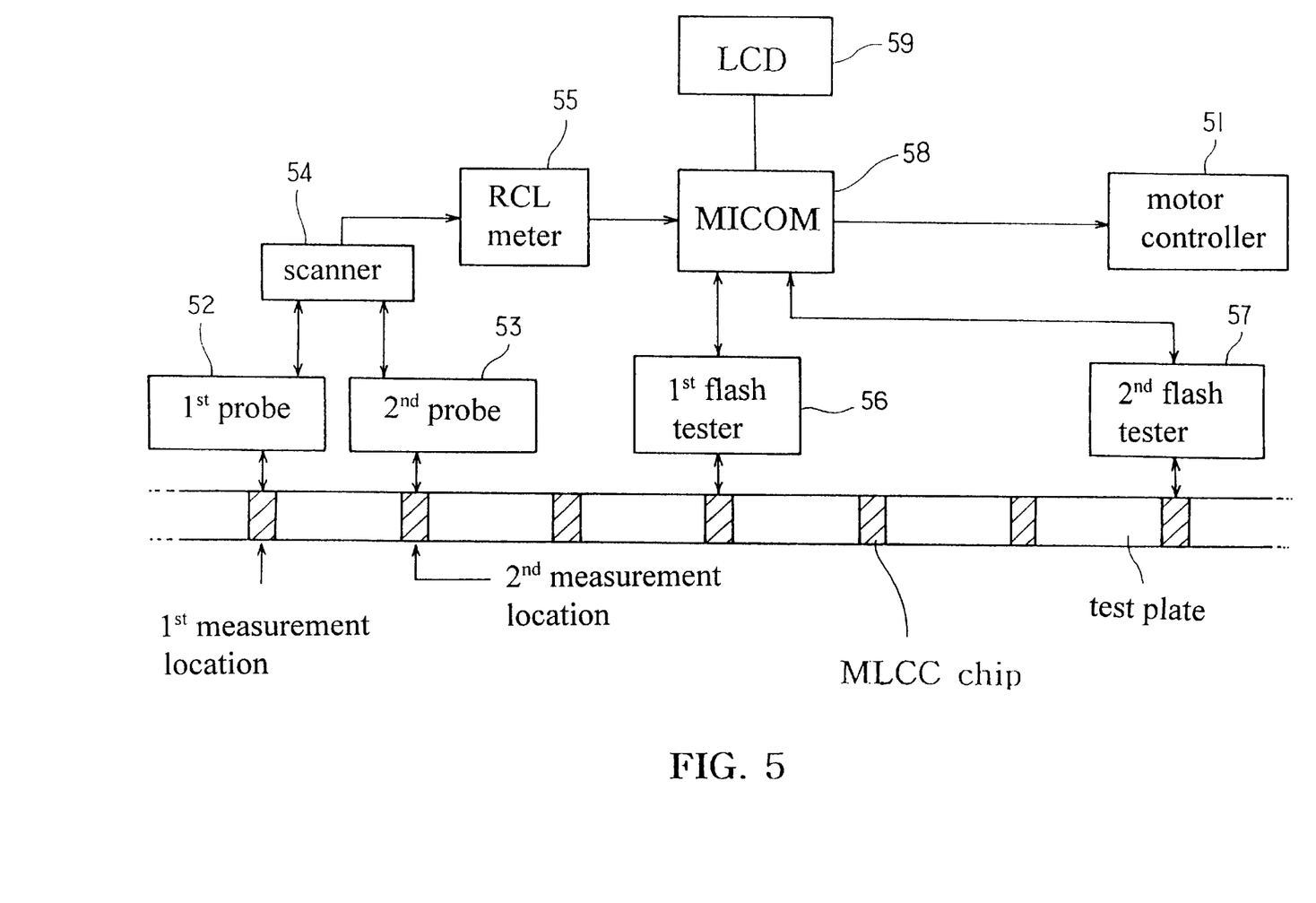
FIG. 5 is a block diagram of the second embodiment of the tester of the present invention.

Referring to FIG. 5, the second embodiment of the double-speed tester of the present invention comprises: a motor controller 51 for controlling the motor according to a signal from the microcomputer 58 so that the test plate rotates two steps at one time; a first probe 52 for connecting to a microelectronic device which stops at a first measurement location; a second probe 53 for connecting to a microelectronic device which stops at a second measurement location adjoining the first measurement location at an interval of one step; a scanner 54 for scanning the first and second probes 52 and 53 to connect them sequentially to an RLC meter 55; the RLC meter 55 for measuring the microelectronic devices connected to the first and second probes 52 and 53 sequentially connected by scanner 54; first and second flash testers 56 and 57 for applying a high voltage to the microelectronic devices whose values are measured by RLC meter 55, according to microcomputer 58, in order to check the degree of insulation which is then sent to the microcomputer; the microcomputer 58 for outputting the control signal which turns ON or OFF the operation of the motor in order to rotate the test plate, comparing the value measured by RLC meter 55, with reference data, in order to check the microelectronic devices' failure or quality, and checking the quality of insulation of the microelectronic device according to the insulation test result by the first or second flash tester 56 or 57; and an LCD 59 for displaying required information and operation status of the tester according to microcomputer 58.

In the first embodiment two RLC meters 44 and 45 are connected to first and second probes 42 and 43, respectively. The second embodiment is different from the first in that the first and second probes 52 and 53 are connected to RLC meter 55 in order to measure microelectronic devices placed at the first and second measurement locations with a single meter, and that scanner 54 is interposed between RLC meter 55 and first and second probes 52 and 53 to connect the probes 52 and 53 sequentially to the meter 55. Scanner 54 first connects first probe 52 to RLC meter 55 so as to measure the microelectronic device coming into contact with the first probe 52 at the first measurement location, and then sends the result to microcomputer 58. Thereafter, the scanner connects the second probe 53 to RLC meter 55 so as to measure the microelectronic device coming into contact with the second probe 52 at the second measurement location, and then sends the result to microcomputer 58.

Referring to FIG. 6C, the moving time is shortened because two measurements occur sequentially between the movement of the tester, which takes relatively long time, thereby reducing the working time taken. The time for RLC meter 55 to measure one microelectronic device is about 32 $\mu s$, and the sequential measurement of the microelectronic devices connected to the first and second probes 52 and 53 consumes about 64 $\mu s$. This is sufficiently smaller than about 80 $\mu s$, the measurement time of first and second flash testers 56 and 57, to enable the microelectronic devices connected to the first and second probes 52 and 53 to be measured within the first and second flash testers 56 and 57's measurement time.

Figure 7:
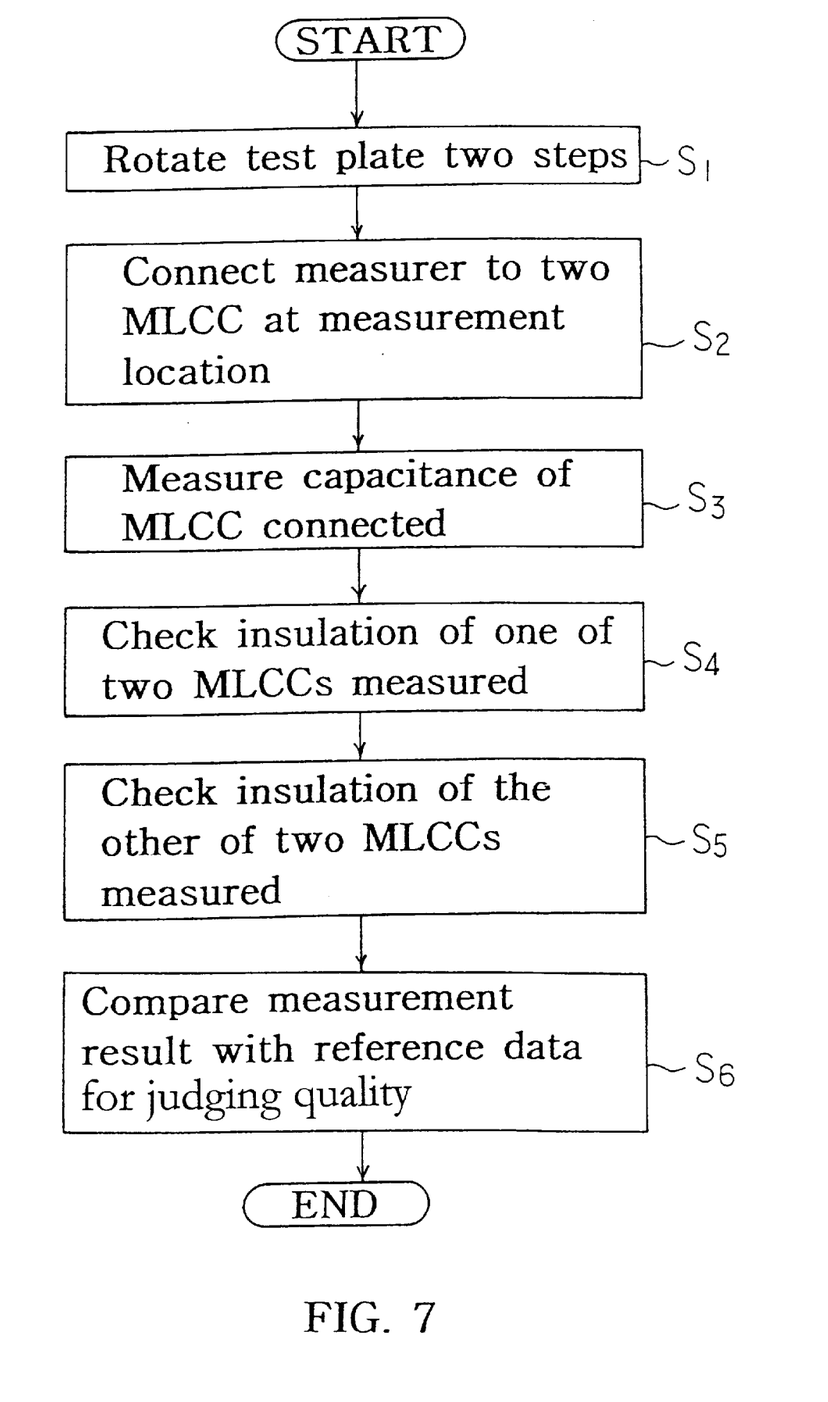
FIG. 7 is a flowchart of showing a method of testing microelectronic devices according to the present invention.

Referring to FIG. 7 showing a method of testing microelectronic devices with the double-speed tester of the present invention, the test plate rotates by two steps at one time in step $S_1$. It is rotated two steps at a high speed because the movement between recesses takes a relatively long time. While the test plate is stationary, the meters connect to the microelectronic devices contained in two nearby recesses in step $S_2$. Microelectronic devices in the two recesses are measured at one time because the test plate moves two steps. Through the meters connected in step $S_2$, devices aligned in the two recesses are measured simultaneously or sequentially in step $S_3$. In case where meters each are connected to the microelectronic devices contained in the two recesses, two microelectronic devices can be measured at the same time. When a single meter is used, the microelectronic devices in the two recesses are connected sequentially to the meter, and measured sequentially. In step $S_4$ a high voltage is applied to one of the microelectronic devices whose values are measured in step $S_3$, in order to check the degree of insulation. To the other microelectronic device whose value is measured in step $S_3$, a high voltage is applied to find out the degree of insulation in step $S_5$. In step $S_6$, the value measured in step $S_3$ is compared with reference data to determine the microelectronic devices' quality, and their insulation quality is decided according to the test result in steps $S_4$ and $S_5$.

It will be apparent to the reader that the foregoing description of the invention has been presented for purposes of illustration and description and for providing an understanding of the invention and that many changes and modifications can be made without departing from the scope of the invention. It is therefore intended that the scope of the invention be indicated by the appended claims rather than by the foregoing description; and all changes which come within the meaning and range of equivalency of the claims are therefore intended to be embraced therein.

What is claimed is:

1. A tester for a microelectronic device, in which a plurality of recesses is formed on the circumference of a test plate at an interval of step, the recesses each accommodating a microelectronic device, the tester comprising:

a motor controller means for controlling a motor so that the test plate rotates two steps at one time;

a first connection means installed at a first measurement location for connecting to the microelectronic device which stops thereat;

a second connection means installed at a second measurement location adjoining the first measurement location at an interval of one step, for connecting to a microelectronic device which stops at the second measurement location;

a first measuring means connected to the first connection means for measuring the device connected to the first connection means;

a second measuring means connected to the second connection means for measuring the device connected to the second connection means;

a first testing means for applying a test voltage to the device whose value is measured by the first measuring means, in order to check the value of its insulation;

a second testing means for applying a test voltage to the device whose value is measured by the second measuring means, in order to check the value of its insulation; and a microcomputer for outputting a control signal which turns ON or OFF the operation of the motor in order to rotate the test plate, and comparing the value measured by the first or second measuring means, with reference data, in order to check the device's failure or quality, the microcomputer further checking the value of insulation of the device according to the insulation test result by the first or second testing means.

2. The tester as claimed in claim 1, wherein the motor controller means controls the motor so that the test plate, which rotates by two steps at one time, turns 1.5–2 times the average speed of that which rotates by one step, with the same acceleration/deceleration profile.

3. The tester as claimed in claim 1, wherein the first and second connection means, which become worn in contact with the microelectronic device to be measured, are replaceable.

4. The tester as claimed in claim 1, wherein the first measuring means operates simultaneously with the second measuring means.

5. The tester as claimed in claim 1, wherein an odd number of recesses is present between the first measuring means and the second testing means so that the microelectronic device whose value is measured by the first measuring means is tested by the second testing means, and wherein an odd number of recesses is present between the second measuring means and the first testing means so that the microelectronic device whose value is measured by the second measuring means is tested by the first testing means.

6. The tester as claimed in claim 4, wherein, in measuring the microelectronic device, the first and second measuring means simultaneously operate so that they take a shorter time than does the first or second testing means.

7. A tester for a microelectronic device, in which a plurality of recesses is formed on the circumference of a test plate at an interval of step, the recesses each accommodating a microelectronic device, the tester comprising:

a motor controller means for controlling a motor so that the test plate rotates two steps at one time;

a first connection means installed at a first measurement location for connecting to the microelectronic device which stops thereat;

a second connection means installed at a second measurement location adjoining the first measurement location at an interval of one step, for connecting to a microelectronic device which stops at the second measurement location;

a measuring means for measuring the device;

a scanning means connected between the first and second connection means and the measuring means for connecting the first and second connection means sequentially to the measuring means;

a first testing means connected to the first connection means for applying a test voltage to the device whose value is measured by the first connection means, in order to check the value of its insulation;

a second testing means connected to the second connection means for applying a test voltage to the device whose value is measured by the second connection means, in order to check the value of its insulation; and a microcomputer for outputting a control signal which turns ON or OFF the operation of the motor in order to rotate the test plate, and comparing the value measured by the measuring means, with reference data, in order to check the device's failure or quality, the microcomputer further checking the value of insulation of the device according to the insulation test result by the first or second testing means.

8. The tester as claimed in claim 7, wherein the motor controller means controls the motor so that the test plate, which rotates by two steps at one time, turns 1.5–2 times the average speed of that which rotates by one step, with the same acceleration/deceleration profile.

9. The tester as claimed in claim 7, wherein the first and second connection means, which become worn in contact with the microelectronic device to be measured, are replaceable.

10. The tester as claimed in claim 7, wherein the measuring means sequentially measures the microelectronic devices respectively connected to the first and second connection means.

11. The tester as claimed in claim 7, wherein an odd number of recesses is present between the first measuring means and the second testing means so that the microelectronic device whose value is measured by the first measuring means is tested by the second testing means, and wherein an odd number of recesses is present between the second measuring means and the first testing means so that the microelectronic device whose value is measured by the second measuring means is tested by the first testing means.

12. The tester as claimed in claim 9, wherein, in measuring the microelectronic device, the first and second measuring means simultaneously operate so that they take a shorter time than does the first or second testing means.

13. A method of testing a microelectronic device, with a test plate having a plurality of recesses formed on its circumference at an interval of step, the recesses each accommodating a microelectronic device, the method comprising the steps of:

(1) controlling a motor so that the test plate rotates by two steps at one time;

(2) connecting a measurer to the microelectronic devices aligned in nearby two recesses while the test plate is stationary;

(3) simultaneously or sequentially measuring the microelectronic devices aligned in the two recesses through the measurer connected in step (2);

(4) applying a test voltage to one of the devices whose values are measured in step (3) in order to check the value of its insulation;

(5) applying a test voltage to the other of the devices whose values are measured in step (3) in order to check the value of its insulation; and (6) comparing the values measured in step (3) with reference data in order to check the device's failure or quality, and determining the value of the device's insulation according to the test results obtained in steps (4) and (5).

\* \* \* \* \*

UNITED STATES PATENT AND TRADEMARK OFFICE
CERTIFICATE OF CORRECTION

PATENT NO.    : 6,198,291 B1
DATED         : March 6, 2001
INVENTOR(S)   : Seok Jong Yu et al.

Page 1 of 1

It is certified that error appears in the above-identified patent and that said Letters Patent is hereby corrected as shown below:

<u>Column 1,</u>
Line 52, "each devices" should read -- each device --.

<u>Column 5,</u>
Line 29, after "In this state" insert comma (,).

Signed and Sealed this

Twelfth Day of February, 2002

Attest:

JAMES E. ROGAN
*Attesting Officer*    *Director of the United States Patent and Trademark Office*